United States Patent
Tan et al.

(10) Patent No.: US 8,762,440 B2
(45) Date of Patent: Jun. 24, 2014

(54) SYSTEMS AND METHODS FOR AREA EFFICIENT NOISE PREDICTIVE FILTER CALIBRATION

(75) Inventors: Weijun Tan, Longmont, CO (US); Kelly Fitzpatrick, Sudbury, MA (US)

(73) Assignee: LSI Corporation, San Jose, CA (US)

( * ) Notice: Subject to any disclaimer, the term of this patent is extended or adjusted under 35 U.S.C. 154(b) by 584 days.

(21) Appl. No.: 13/180,311

(22) Filed: Jul. 11, 2011

(65) Prior Publication Data

US 2013/0016846 A1 Jan. 17, 2013

(51) Int. Cl.
*G06F 17/10* (2006.01)
*H03H 21/00* (2006.01)

(52) U.S. Cl.
CPC ................ *H03H 21/0012* (2013.01)
USPC .......................... 708/322; 360/53; 381/71.11

(58) Field of Classification Search
CPC ............... H04L 25/03993; H04L 25/03057; H04L 25/03299; H04L 2025/03503; H04L 1/0001; H04L 25/0305; H04L 25/03343; H03H 21/0012; G10K 11/16; G10K 11/178; G10K 2210/1282; G10K 2210/12821; G10K 2210/30231; G10K 11/17842
USPC .......................... 381/71.11–71.14, 71.1–71.4, 381/94.1–94.4, 66, 56; 369/43, 53.12, 369/44.34; 700/94; 708/322, 323, 300; 360/39, 53

See application file for complete search history.

(56) References Cited

U.S. PATENT DOCUMENTS

| | | | |
|---|---|---|---|
| 5,262,904 A | 11/1993 | Tang et al. | |
| 5,357,520 A | 10/1994 | Arnett et al. | |
| 5,493,454 A | 2/1996 | Ziperovich et al. | |
| 5,517,146 A | 5/1996 | Yamasaki | |
| 5,583,705 A | 12/1996 | Ziperovich et al. | |
| 5,781,358 A | 7/1998 | Hasegawa | |
| 5,872,664 A | 2/1999 | Meier | |
| 5,986,830 A | 11/1999 | Hein | |
| 5,999,355 A | 12/1999 | Behrens et al. | |
| 6,043,942 A | 3/2000 | Cunningham et al. | |
| 6,091,560 A | 7/2000 | Du | |

(Continued)

FOREIGN PATENT DOCUMENTS

DE 10127447 10/2002
GB 2 320 866 9723484.3 6/1997

OTHER PUBLICATIONS

U.S. Appl. No. 12/199,325, filed Aug. 27, 2008, Mathew.
U.S. Appl. No. 12/273,265, filed Nov. 18, 2008, Mathew.

(Continued)

*Primary Examiner* — Lun-see Lao
(74) *Attorney, Agent, or Firm* — Hamilton DeSanctis & Cha (57) ABSTRACT

Various embodiments of the present invention provide systems and methods for data processing. As an example, a data processing circuit is discussed that includes: a noise predictive filter circuit, a mean calculation circuit, a summation circuit, and a filter tap adaptation circuit. The noise predictive filter circuit is operable to perform a noise predictive filtering process on a data input based upon a selector input to yield a noise predictive output. The selector input is derived from a data detector output. The mean calculation circuit is operable to average two or more instances of the noise predictive output to yield a mean output. The summation circuit is operable to subtract the mean output from the noise predictive output to yield a sum output. The filter tap adaptation circuit is operable to adaptively calculate a filter tap based at least in part on a value derived from the data input and a value derived from the sum output.

22 Claims, 6 Drawing Sheets

(56) References Cited

U.S. PATENT DOCUMENTS

| | | | |
|---|---|---|---|
| 6,130,794 | A | 10/2000 | Christensen |
| 6,134,691 | A | 10/2000 | Hirasaka |
| 6,141,168 | A | 10/2000 | Takahashi et al. |
| 6,147,828 | A | 11/2000 | Bloodworth et al. |
| 6,181,505 | B1 | 1/2001 | Sacks et al. |
| 6,208,477 | B1 | 3/2001 | Cloke et al. |
| 6,208,481 | B1 | 3/2001 | Spurbeck et al. |
| 6,212,024 | B1 | 4/2001 | Igarashi et al. |
| 6,243,031 | B1 | 6/2001 | Jusuf et al. |
| 6,246,723 | B1 | 6/2001 | Bliss et al. |
| 6,337,778 | B1 | 1/2002 | Gagne |
| 6,396,651 | B1 | 5/2002 | Grover |
| 6,404,572 | B1 | 6/2002 | Hong |
| 6,535,345 | B1 | 3/2003 | Shimoba |
| 6,563,655 | B1 | 5/2003 | Yamasaki et al. |
| 6,621,648 | B2 | 9/2003 | Elliott et al. |
| 6,662,303 | B1 | 12/2003 | Toosky et al. |
| 6,671,244 | B2 | 12/2003 | Honma |
| 6,674,590 | B2 | 1/2004 | Ottesen et al. |
| 6,678,230 | B2 | 1/2004 | Mayashita et al. |
| 6,721,114 | B1 | 4/2004 | Sutardja et al. |
| 6,788,481 | B2 | 9/2004 | Fang et al. |
| 6,894,854 | B1 | 5/2005 | Carlson et al. |
| 6,912,682 | B1 | 6/2005 | Aoki |
| 6,934,100 | B2 | 8/2005 | Ueno |
| 6,937,415 | B2 | 8/2005 | Galbraith et al. |
| 7,012,772 | B1 | 3/2006 | Vis |
| 7,079,342 | B1 | 7/2006 | Han et al. |
| 7,092,179 | B2 | 8/2006 | Yamanouchi |
| 7,092,180 | B2 | 8/2006 | Franck |
| 7,123,429 | B2 | 10/2006 | Musungu et al. |
| 7,126,773 | B1 | 10/2006 | Taratorin |
| 7,139,143 | B2 | 11/2006 | Tsunoda et al. |
| 7,170,704 | B2 | 1/2007 | DeGroat et al. |
| 7,193,802 | B2 | 3/2007 | Cideciyan et al. |
| 7,248,424 | B2 | 7/2007 | Ueno |
| 7,256,954 | B2 | 8/2007 | Serizawa |
| 7,262,928 | B1 | 8/2007 | Oberg |
| 7,271,753 | B1 | 9/2007 | Padukone et al. |
| 7,308,057 | B1 | 12/2007 | Patapoutian |
| 7,426,236 | B1 | 9/2008 | He |
| 7,440,224 | B2 | 10/2008 | Ehrlich et al. |
| 7,495,854 | B2 | 2/2009 | Hutchins et al. |
| 7,542,227 | B2 | 6/2009 | Che et al. |
| 7,696,838 | B2 | 4/2010 | Wada |
| 7,715,135 | B1 | 5/2010 | Sutardja et al. |
| 7,733,591 | B2 | 6/2010 | Bottemiller et al. |
| 8,566,379 | B2 * | 10/2013 | Yang .................... 708/323 |
| 8,667,039 | B2 * | 3/2014 | Ivkovic et al. ........... 708/322 |
| 2002/0012185 | A1 * | 1/2002 | Sawaguchi et al. ........... 360/46 |
| 2003/0026354 | A1 | 2/2003 | Chang et al. |
| 2005/0117243 | A1 | 6/2005 | Serizawa et al. |
| 2005/0169415 | A1 | 8/2005 | Nayak et al. |
| 2006/0061496 | A1 | 3/2006 | Stein et al. |
| 2006/0062125 | A1 | 3/2006 | Horie et al. |
| 2006/0176947 | A1 | 8/2006 | Lim |
| 2006/0232871 | A1 | 10/2006 | Brittenham |
| 2007/0041115 | A1 | 2/2007 | Lee |
| 2007/0047120 | A1 | 3/2007 | DeGroat |
| 2007/0064836 | A1 | 3/2007 | Byrne et al. |
| 2007/0076313 | A1 | 4/2007 | Hutchins et al. |
| 2007/0140088 | A1 | 6/2007 | Hino et al. |
| 2007/0236270 | A1 | 10/2007 | Chiang et al. |
| 2007/0260623 | A1 | 11/2007 | Jaquette et al. |
| 2008/0031114 | A1 | 2/2008 | Hong et al. |
| 2008/0032652 | A1 | 2/2008 | Zhao et al. |
| 2008/0037153 | A1 | 2/2008 | Yoshizawa |
| 2008/0081382 | A1 | 10/2008 | Mathew |
| 2009/0230639 | A1 | 1/2009 | Liu |
| 2009/0033680 | A1 | 2/2009 | Ratnakar Aravind |
| 2009/0161245 | A1 | 6/2009 | Mathew |
| 2011/0007907 | A1 * | 1/2011 | Park et al. .................... 381/71.8 |
| 2012/0057720 | A1 * | 3/2012 | Van Leest .................. 381/71.11 |

OTHER PUBLICATIONS

U.S. Appl. No. 12/337,775, filed Dec. 18, 2008, Mathew.
U.S. Appl. No. 12/337,805, filed Dec. 18, 2008, Mueller.
U.S. Appl. No. 12/337,828, filed Dec. 18, 2008, Mueller.
U.S. Appl. No. 12/337,850, filed Dec. 18, 2008, Mueller.
U.S. Appl. No. 12/348,236, filed Jan. 2, 2009, Liu.
U.S. Appl. No. 12/371,906, filed Feb. 16, 2009, Ratnakar Aravind.
U.S. Appl. No. 12/430,948, filed Apr. 28, 2009, Grundvig.
U.S. Appl. No. 12/247,378, filed Apr. 8, 2010, Mathew.
U.S. Appl. No. 12/463,626, filed May 11, 2009, Mathew.
U.S. Appl. No. 12/510,222, filed Jul. 27, 2009, Ratnakar Aravind.
U.S. Appl. No. 12/558,928, filed Sep. 14, 2009, Mahtew.
U.S. Appl. No. 12/663,325, filed Apr. 20, 2010, Mahtew.
U.S. Appl. No. 12/652,201, filed Jan. 5, 2010, Mahtew.
U.S. Appl. No. 13/100,063, filed May 3, 2011, Jin, Ming et.al.
U.S. Appl. No. 13/180,311, filed Jul. 11, 2011, Tan, Weijun et.al.
Cho and Lee, "An Estimation Technique for Nonlinear Distortion in High Density Magnetic Recording Channels", IEEE Transactions on Magnetics, vol. 34, No. 1, pp. 40-44 Jan. 1998.
Barry J. et al "Iterative Timing Recovery" IEEE Signal Processing Magazine vol. 21, No. 1, Jan. 1, 2004.
Degroat et al., "Experimental Characterization of Media Noise Based on Equalized Synchronized Drive Data", IEEE Trans. Magnetics, vol. 37, No. 2, pp. 633-638, Mar. 2001.
Farhang-Boroujeny, Adaptive Filters: Theory and Applications. John Wiley & Sons Ltd, 1998, Chapter 11. pp. 373-379.
Kavcic and Patapoutian, "A Signal-Dependent Autoregressive Channel Model", IEEE Trans. Magnetics, vol. 35 No. 5, pp. 2316-2318, Sep. 1999.
Lin et al. "An estimation technique for accurately modelling the magnetic recording channel including nonlinearities." IEEE Trans. Mag, vol. 25, No. 5, pp. 4084-4086, Sep. 1989.
Moon, J., "Signal-to-Noise Ratio Definition for Magnetic Recording Channels With Transition Noise", IEEE Trans. Magnetics, vol. 36, No. 5, pp. 3881-3883, Sep. 2000.
Palmer et al, "Identification of nonlinear write effects using pseudorandom sequences" IEEE Trans. Magnetics, vol. 23 No. 5, pp. 2377-2379, Sep. 1987.
Partovi; et al., "Flow-Through Latch and Edge-Triggered Flip-Flop Hybrid Elements"; Feb. 8, 1996; pp. 138-139; Solid-State Circuits Conf Digest of Technical Papers IEEE.
Tokumasu et al. "A New Reduced Clock-Swing Flip-Flop (NDKFF)," Corporate Research & Development Center, Toshiba Corporation. IEEE Feb. 2002 Custom Intergrated Circuits Conf.
Wood and Donaldson, "The Helical-Scan Magnetic Tape Recorder as a Digital Communication Channel", IEEE Transactions on Magnetics, vol. MAG-15, No. 2, pp. 935-943 Mar. 1979.

\* cited by examiner

SYSTEMS AND METHODS FOR AREA EFFICIENT NOISE PREDICTIVE FILTER CALIBRATION

BACKGROUND OF THE INVENTION

The present invention is related to systems and methods for detecting and/or decoding information, and more particularly to systems and methods for performing noise predictive filtering.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any data losses caused by various factors. In some cases, an encoding/decoding process is used to enhance the ability to detect a data error and to correct such data errors. As an example, a simple data detection and decode may be performed, however, such a simple process often lacks the capability to converge on a corrected data stream.

Figure 1:
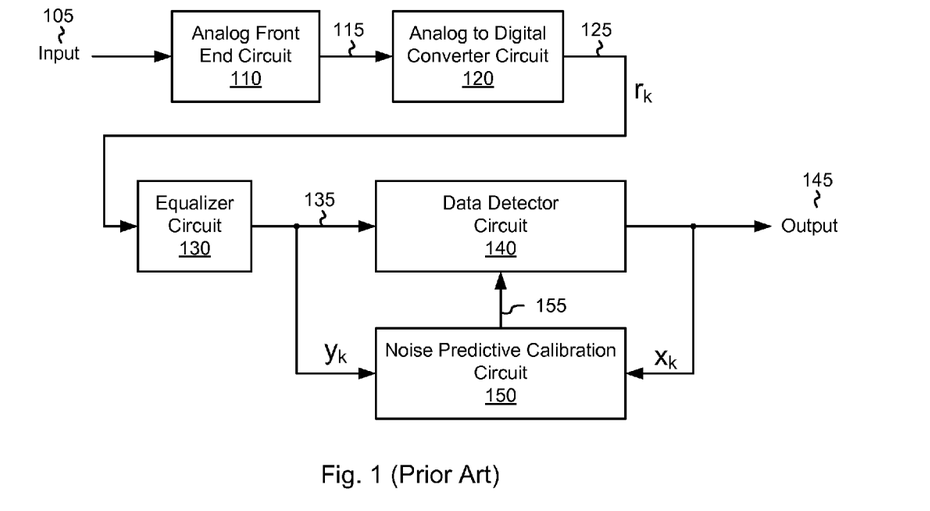
FIG. 1 depicts a prior art data processing circuit including a noise predictive calibration circuit.

To heighten the possibility of convergence, noise predictive filtering may be used. Turning to FIG. 1, an exemplary prior art data processing circuit 100 including a noise predictive calibration circuit 150 is depicted. Data processing circuit 100 receives a data input 105 that is applied to a an analog front end circuit 110 that yields an analog output 115. Analog output 115 is provided to an analog to digital converter circuit 120 where it is sampled to generate a series of digital samples 125. Digital samples 125 are equalized using an equalizer circuit 130, and a resulting equalized output 135 is provided to both a data detector circuit 140 and a noise predictive calculation circuit 150. Data detector circuit 140 applies a data detection algorithm to yield an output 145. Both output 145 and equalized output 135 are used by noise predictive calibration circuit 150. Noise predictive calibration circuit 150 provides a noise predictive output 155 to data detector circuit 140 that is used to guide the detection algorithm. In some cases, such noise predictive filtering is not sufficiently effective to yield convergence, and/or is costly in terms of area and power.

Hence, for at least the aforementioned reasons, there exists a need in the art for advanced systems and methods for data processing.

BRIEF SUMMARY OF THE INVENTION

The present invention is related to systems and methods for detecting and/or decoding information, and more particularly to systems and methods for performing noise predictive filtering.

Various embodiments of the present invention provide data processing circuits. The data processing circuits include: a noise predictive filter circuit, a mean calculation circuit, a summation circuit, and a filter tap adaptation circuit. The noise predictive filter circuit is operable to perform a noise predictive filtering process on a data input based upon a selector input to yield a noise predictive output. The selector input is derived from a data detector output. The mean calculation circuit is operable to average two or more instances of the noise predictive output to yield a mean output. The summation circuit is operable to subtract the mean output from the noise predictive output to yield a sum output. The filter tap adaptation circuit is operable to adaptively calculate a filter tap based at least in part on a value derived from the data input and a value derived from the sum output. In some instances of the aforementioned embodiments, the circuit is implemented as part of an integrated circuit. In various instances of the aforementioned embodiments, the circuit is implemented as part of a storage device or a a wireless communication device.

In particular instances of the aforementioned embodiments, the value derived from the data input is the data input, and the value derived from the sum output is the sum output. In one or more instances of the aforementioned embodiments, the circuit further includes a tap gain value. In such instances, the filter tap adaptation circuit is further operable to adaptively calculate the filter tap based at least in part on the tap gain value. In one or more cases, the tap gain value is programmable. In various instances of the aforementioned embodiments, the mean calculation circuit is a first mean calculation circuit, the mean output is a first mean output, the summation circuit is a first summation circuit, and the sum output is a first sum output. In some such instances, the circuits further include: a second mean calculation circuit, and a second summation circuit. The second mean calculation circuit is operable to calculate an average of two or more instances of the data input to yield a second mean output, and the second summation circuit operable to subtract the second mean output from the data input to yield a second sum output. In such instances, the value derived from the data input is the second sum output.

In various instances of the aforementioned embodiments, the summation circuit is a first summation circuit and the sum output is a first sum output. In such instances, the circuit further includes a second summation circuit operable to subtract a bias value from the first sum output to yield an error value, and a bias calculation circuit operable to calculate the bias value based at least in part on a bias gain and the error value. In some cases, the bias gain is user programmable.

On one or more instances of the aforementioned embodiments, the circuits further includes a memory circuit operable to store a number of instances of the data detector output to yield the selector input. In some instances of the aforementioned embodiments, the circuits further include a data detector circuit operable to apply a data detection algorithm to the data input to yield the data detector output. In various instances of the aforementioned embodiments, the data detector circuit is a Viterbi algorithm detector circuit or a maximum a posteriori data detector circuit.

Other embodiments of the present invention provide data storage devices that include: a storage medium maintaining a representation of an input data set, an analog front end circuit, an equalizer circuit, and a data processing circuit. The analog front end circuit is operable to sense the representation of the input data set and to provide the input data set as an analog input. The analog to digital converter circuit is operable to convert the analog input into a series of digital samples. The equalizer circuit is operable to receive the series of digital samples to yield a data input. The data processing circuit includes: a noise predictive filter circuit, a mean calculation circuit, a summation circuit, and a filter tap adaptation circuit. The noise predictive filter circuit is operable to perform a noise predictive filtering process on a data input based upon a selector input to yield a noise predictive output. The selector input is derived from a data detector output. The mean calculation circuit is operable to average two or more instances of the noise predictive output to yield a mean output. The summation circuit is operable to subtract the mean output from the noise predictive output to yield a sum output. The filter tap adaptation circuit is operable to adaptively calculate a filter tap based at least in part on a value derived from the data input and a value derived from the sum output.

Yet other embodiments of the present invention provide data transmission devices that include a receiver with a data processing circuit. The data processing circuit includes: a noise predictive filter circuit, a mean calculation circuit, a summation circuit, and a filter tap adaptation circuit. The noise predictive filter circuit is operable to perform a noise predictive filtering process on a data input based upon a selector input to yield a noise predictive output. The selector input is derived from a data detector output. The mean calculation circuit is operable to average two or more instances of the noise predictive output to yield a mean output. The summation circuit is operable to subtract the mean output from the noise predictive output to yield a sum output. The filter tap adaptation circuit is operable to adaptively calculate a filter tap based at least in part on a value derived from the data input and a value derived from the sum output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for detecting and/or decoding information, and more particularly to systems and methods for performing noise predictive filtering.

Turning to FIG. 1, a prior art data processing circuit 100 including a noise predictive filter circuit is depicted. Data processing circuit 100 includes an analog front end circuit 110 that receives an input ($i_k$) 105. Input 105 may be derived from, for example, a storage medium. Such a storage medium may be, for example, a magnetic storage disk. Based upon the disclosure provided herein, one of ordinary skill in the art will recognize a variety of storage media or other sources from which analog input signal 105 may be derived. Analog front end circuit 110 processes input 105 and provides a processed analog signal 115 to an analog to digital converter circuit 120. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110.

Analog to digital converter circuit 120 converts processed analog signal 115 into a corresponding series of digital samples ($r_k$) 125 synchronous to a synchronization clock (not shown). Analog to digital converter circuit 120 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention.

Digital samples 125 may be expressed by the following equation:

$$r_k = i_k h_0 + i_{k-1} h_1 + i_{k-2} h_2 + \ldots i_{k-1} h_1 + W_k' + J_k',$$

where i is input 105, h is the channel response model, W' is unfiltered non-data dependent noise, and J' is unfiltered data dependent noise at a given bit period k. Digital samples 125 are provided to an equalizer circuit 130. In the depicted embodiment, equalizer circuit 130 is a digital finite impulse response filter as are known in the art. Based upon the disclosure provided herein, one of ordinary skill in the art will recognize a variety of equalizer circuits that may be used in relation to different embodiments of the present invention. Equalizer circuit 130 provides a filtered output ($y_k$) 135 to a data detector circuit 140, and to a noise predictive calibration circuit 150. Filtered output 135 may be expressed by the following equation:

$$y_k = i_k g_0 + i_{k-1} g_1 + i_{k-2} g_2 + \ldots i_{k-i} g_i + W_k + J_k,$$

where i is input 105, g is a set of target filter taps used by equalizer circuit 130, W is filtered non-data dependent noise, and J is filtered data dependent noise at a given bit period k (i.e., J is a function of $x_k, x_{k-1}, x_{k-2} \ldots$). In one particular case, g is a two tap filter with coefficients of 8 and 14. Data detector circuit 140 applies a data detection algorithm to filtered output 135 to yield an output ($x_k$) 145. Noise predictive calibration circuit 150 uses filtered output 135 and output 145 to calculate a calibration output 155 that is provided as a control for the data detection algorithm applied by data detector circuit 140.

Figure 2:
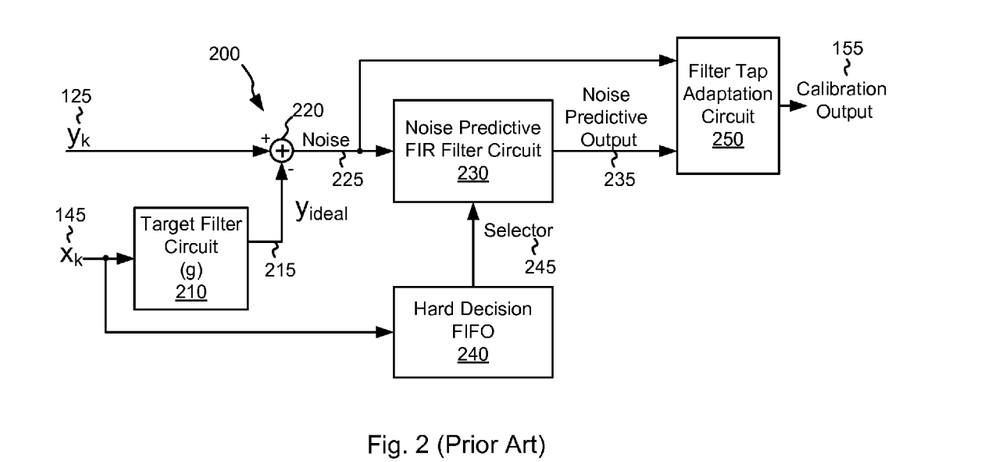
FIG. 2 depicts a prior art noise predictive calibration circuit.

Turning to FIG. 2, a prior art noise predictive calibration circuit 200 is shown. Noise predictive calibration circuit may be used in place of noise predictive calibration circuit 150 discussed above in relation to FIG. 1. Noise predictive calibration circuit 200 includes a target filter circuit 210 that performs a target filtering of output 145 to yield an ideal output ($y_{ideal}$) 215. Ideal output 215 is subtracted from digital samples 125 using a summation circuit 220 to yield a noise output 225 in accordance with the following equation:

$$\text{Noise} = y_k - y_{ideal}.$$

Noise output 225 is provided to a noise predictive finite impulse response filter circuit 230. Noise predictive finite impulse response filter circuit 230 includes a number of finite impulse response filter circuits each tuned to a data pattern, and a selected one of the finite impulse response filter circuits provides a noise predictive output 235.

In addition, output 145 is provided to a hard decision FIFO 240 that stores a number of bit periods of output 145 on a first in, first out basis. A selector output 245 includes a number of recently received instances of output 145. Selector output 245 selects one of the finite impulse response filter circuits included in noise predictive finite impulse response filter circuit 230. Where, for example, noise predictive finite impulse response filter circuit 230 includes sixteen finite impulse response filter circuits, selector output 245 consists of the four most recent instances of output 145 ($x_k$, $x_{k-1}$, $x_{k-2}$, $x_{k-3}$). Noise predictive output 235 and noise output 225 are provided to a filter tap adaptation circuit 250 that calculates calibration output 255.

Figure 3:
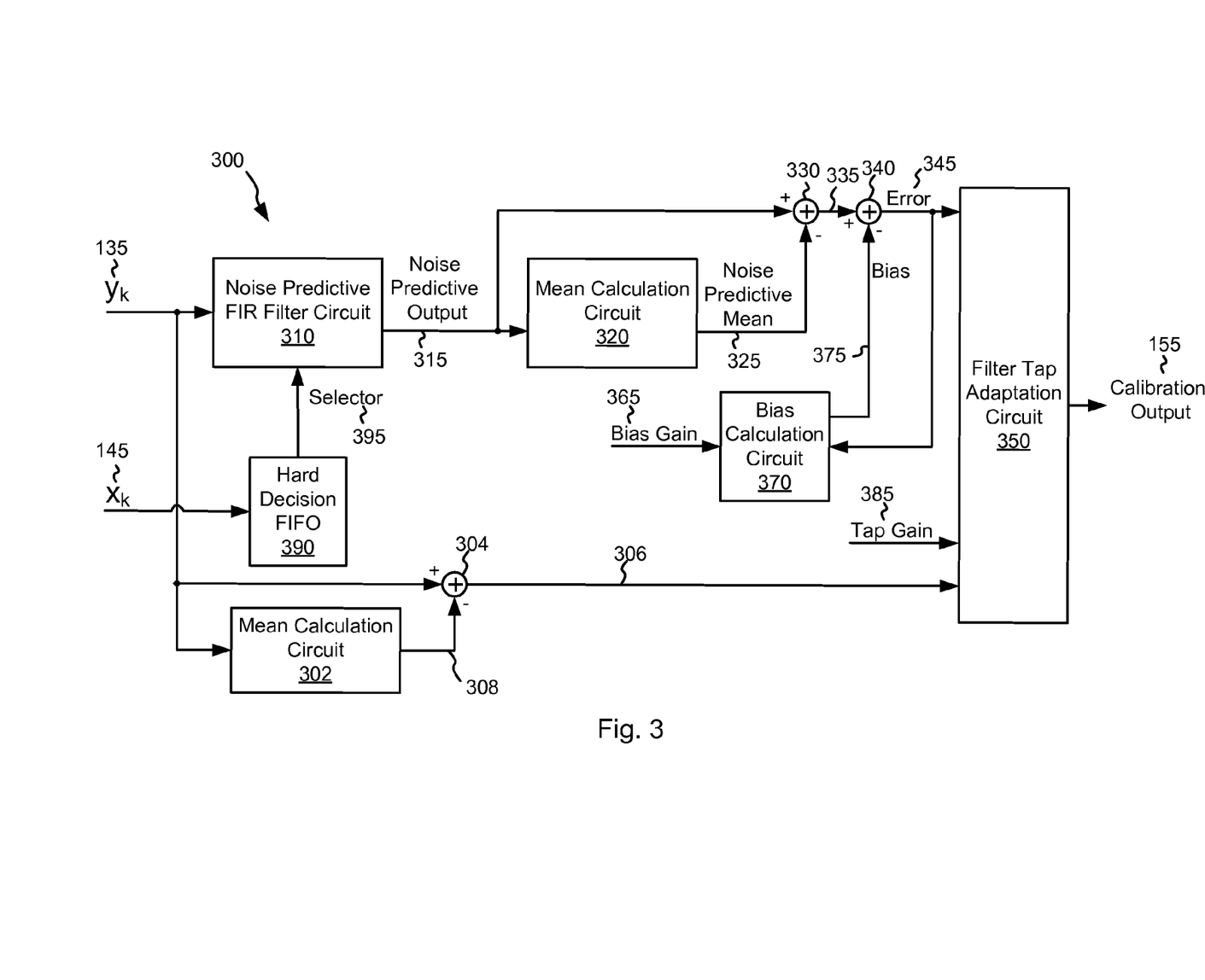
FIG. 3 depicts a noise predictive calibration circuit in accordance with various embodiments of the present invention.

Turning to FIG. 3, a noise predictive calibration circuit 300 is shown in accordance with various embodiments of the present invention. Noise predictive calibration circuit 300 includes a noise predictive finite impulse response filter circuit 310 that performs noise predictive filtering on filtered output ($y_k$) 135 to yield a noise predictive output 315. Noise predictive finite impulse response filter circuit 310 includes a number of finite impulse response filter circuits each tuned to a different noise pattern, and a selected one of the finite impulse response filter circuits provides a noise predictive output 315.

Output 145 is provided to a hard decision FIFO 390 that stores a number of bit periods of output 145 on a first in, first out basis. A selector output 395 includes a number of recently received instances of output 145. Selector output 395 selects one of the finite impulse response filter circuits included in noise predictive finite impulse response filter circuit 310. Where, for example, noise predictive finite impulse response filter circuit 310 includes sixteen finite impulse response filter circuits, selector output 395 consists of the four most recent instances of output 145 ($X_k$, $X_{k-1}$, $X_{k-2}$, $X_{k-3}$).

In addition, filtered output 135 is provided to a mean calculation circuit 302. Mean calculation circuit 302 calculates an average filtered output ($y_{mean}$) 308, and provides average filtered output 308 to a summation circuit 304. In some embodiments of the present invention, averaged filtered output 308 is an average of a defined number of instances of filtered output 135. In one particular embodiment, the defined number is one thousand instances or more. Based upon the disclosure provided herein, one of ordinary skill in the art will recognize a variety of values for the defined number. Summation circuit 304 subtracts averaged filtered output 308 from filtered output 135 to yield a reduced output 306 in accordance with the following equation:

reduced output 306=$y_k$-$y_{mean}$.

Noise predictive output 315 is provided to a mean calculation circuit 320. Mean calculation circuit 320 calculates a noise predictive mean (NPFIR$_{mean}$) 325, and provides noise predictive mean 325 to a summation circuit 330. In some embodiments of the present invention, noise predictive mean 325 is an average of a defined number of instances of noise predictive output 315. In one particular embodiment, the defined number is one thousand instances or more. Based upon the disclosure provided herein, one of ordinary skill in the art will recognize a variety of values for the defined number. Summation circuit 330 subtracts noise predictive mean 325 from noise predictive output 315 to yield a sum 335 to yield sum 335 in accordance with the following equation:

Sum 335=Noise Predictive Output$_k$–NPFIR$_{mean}$.

Sum 335 is provided to a summation circuit 340.

A bias gain 365 is provided to a bias calculation circuit 370 where it is used to adaptively calculate a bias value 375. In some embodiments of the present invention, bias gain 365 is user programmable. In other embodiments, bias gain 365 is a fixed value. Summation circuit 340 subtracts bias value 375 from sum 335 to yield an error 345 in accordance with the following equation:

Error 345=sum 335–bias value 375.

Bias value 375 is adaptively updated for each bit period in accordance with the following equation:

Bias Value 375=Bias Value 375+(Bias Gain 365)(Error 345).

Error 345, reduced output 306, and a tap gain 385 are provided to a filter tap adaptation circuit 350 that calculates calibration output ($f_j$) 155. Filter tap adaptation circuit 350 adaptively calculates calibration output 155 in accordance with the following equation:

$f_j$=$f_j$–(tap gain 385)(error 345)(reduced output 306), where $f_j$ is a number (j) of filter taps used by data detector circuit 140. In some embodiments tap gain 385 is programmable, while in other embodiments it is fixed.

Figure 4:
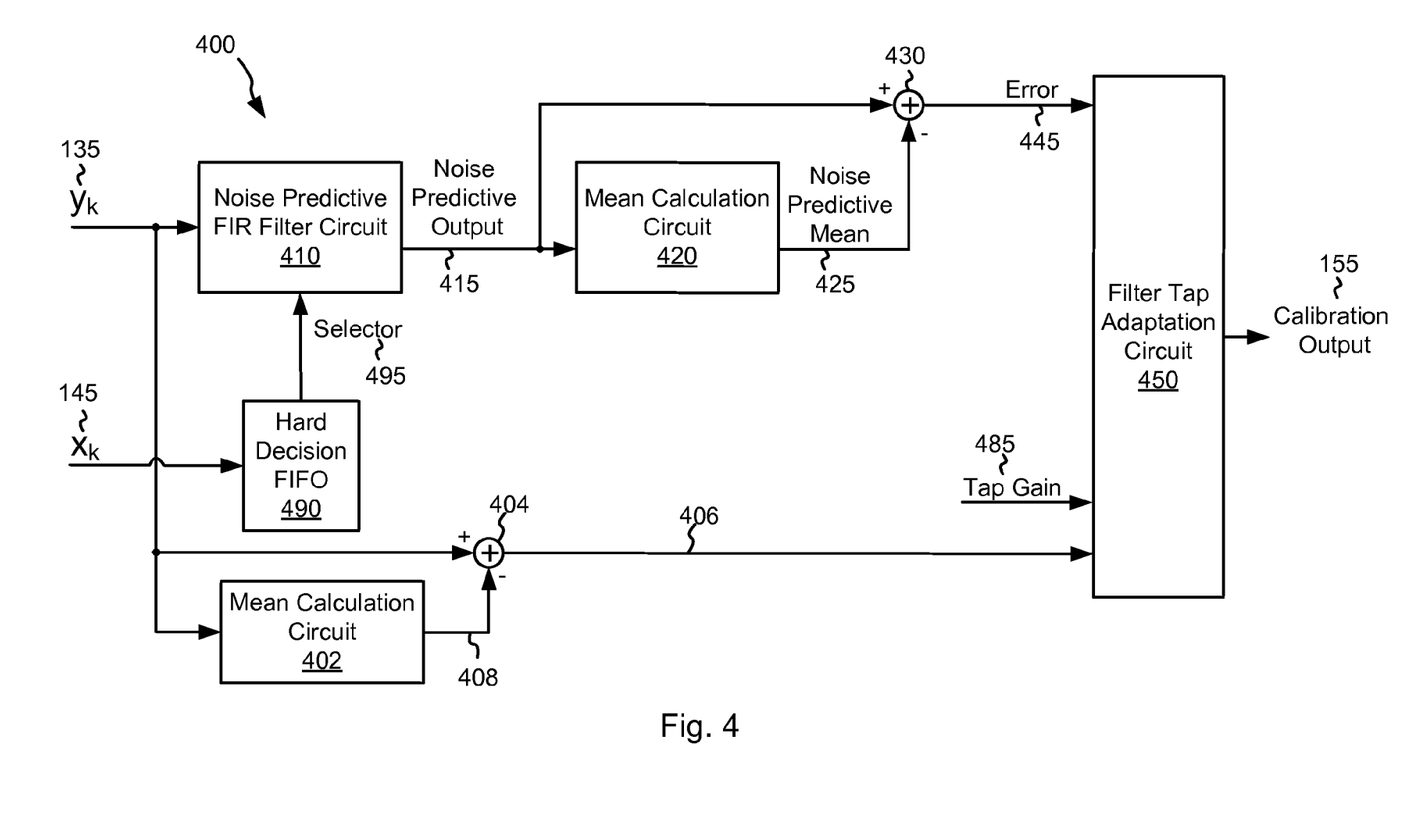
FIG. 4 depicts another noise predictive calibration circuit in accordance with other embodiments of the present invention.

Turning to FIG. 4, another noise predictive calibration circuit 400 is shown in accordance with some embodiments of the present invention. Noise predictive calibration circuit 400 includes a noise predictive finite impulse response filter circuit 410 that performs noise predictive filtering on filtered output ($y_k$) 135 to yield a noise predictive output 415. Noise predictive finite impulse response filter circuit 410 includes a number of finite impulse response filter circuits each tuned to a different noise pattern, and a selected one of the finite impulse response filter circuits provides a noise predictive output 415.

Output 145 is provided to a hard decision FIFO 490 that stores a number of bit periods of output 145 on a first in, first out basis. A selector output 495 includes a number of recently received instances of output 145. Selector output 495 selects one of the finite impulse response filter circuits included in noise predictive finite impulse response filter circuit 410. Where, for example, noise predictive finite impulse response filter circuit 410 includes sixteen finite impulse response filter circuits, selector output 495 consists of the four most recent instances of output 145 ($X_k$, $X_{k-1}$, $X_{k-2}$, $X_{k-3}$).

In addition, filtered output 135 is provided to a mean calculation circuit 402. Mean calculation circuit 402 calculates an average filtered output ($y_{mean}$) 408, and provides average filtered output 408 to a summation circuit 404. In some embodiments of the present invention, averaged filtered output 408 is an average of a defined number of instances of filtered output 135. In one particular embodiment, the defined number is one thousand instances or more. Based upon the disclosure provided herein, one of ordinary skill in the art will recognize a variety of values for the defined number. Summation circuit 404 subtracts averaged filtered output 408 from filtered output 135 to yield a reduced output 406 in accordance with the following equation:

reduced output 406=$y_k$-$y_{mean}$.

Noise predictive output 415 is provided to a mean calculation circuit 420. Mean calculation circuit 420 calculates a noise predictive mean (NPFIR$_{mean}$) 425, and provides noise predictive mean 425 to a summation circuit 430. In some embodiments of the present invention, noise predictive mean 425 is an average of a defined number of instances of noise predictive output 415. In one particular embodiment, the defined number is one thousand instances or more. Based upon the disclosure provided herein, one of ordinary skill in the art will recognize a variety of values for the defined number. Summation circuit 430 subtracts noise predictive mean (NPFIR$_{mean}$) 425 from noise predictive output 415 to yield an error 445.

Error 445, reduced output 406, and a tap gain 485 are provided to a filter tap adaptation circuit 450 that calculates calibration output (f$_j$) 155. Filter tap adaptation circuit 450 adaptively calculates calibration output 155 in accordance with the following equation:

$$f_j=f_j-(\text{tap gain 485})(\text{error 445})(\text{reduced output 406}),$$

where f$_j$ is a number (j) of filter taps used by data detector circuit 140. In some embodiments tap gain 485 is programmable, while in other embodiments it is fixed. In comparison with noise predictive calibration circuit 300 described above in relation to FIG. 3, noise predictive calibration circuit 400 does not include bias calculation circuit 370 as bias value 375 is typically zero because the non-linear term is included in noise predictive mean 425.

Figure 5:
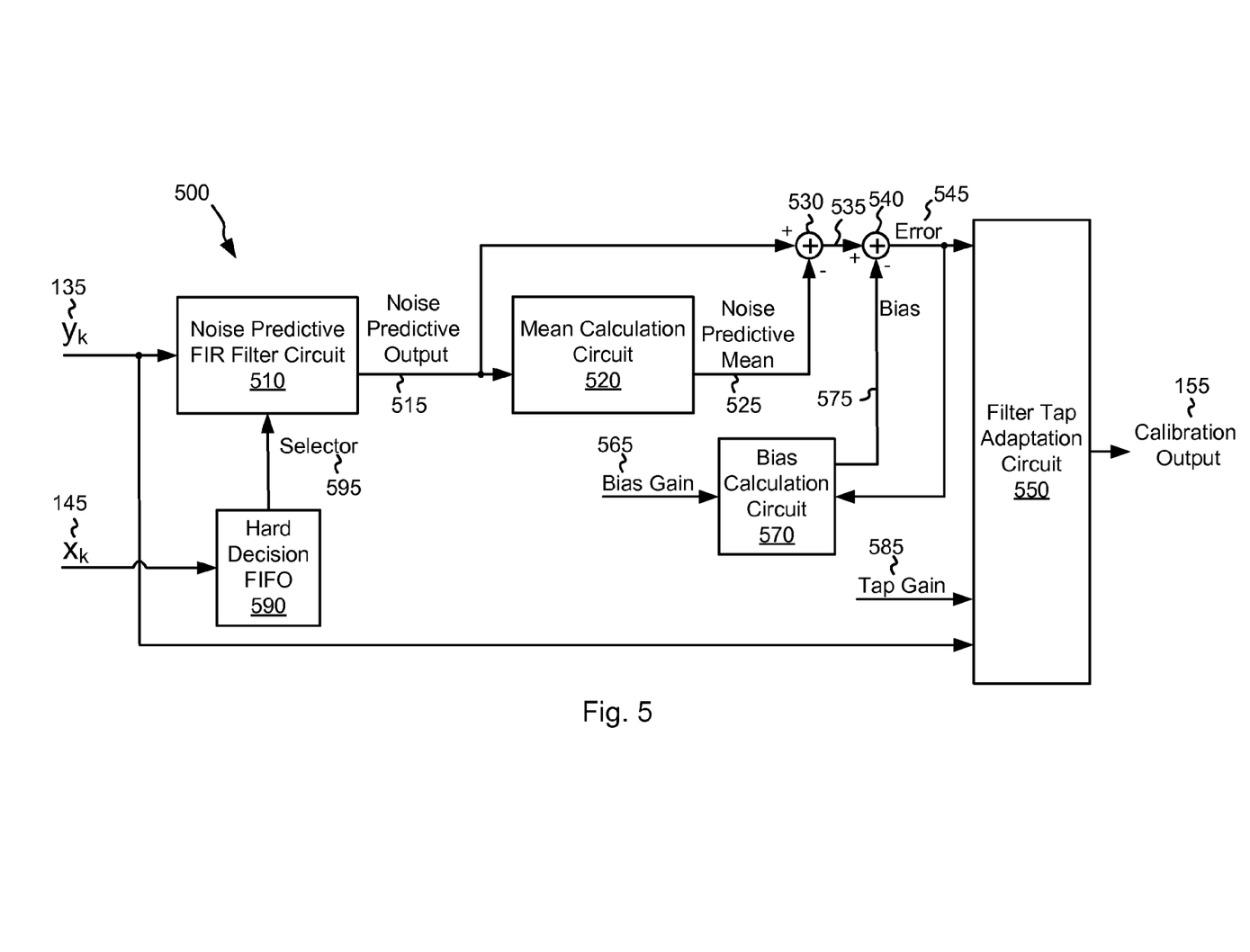
FIG. 5 depicts yet another noise predictive calibration circuit in accordance with other embodiments of the present invention.

Turning to FIG. 5, a noise predictive calibration circuit 300 is shown in accordance with various embodiments of the present invention. Noise predictive calibration circuit 500 includes a noise predictive finite impulse response filter circuit 510 that performs noise predictive filtering on filtered output (y$_k$) 135 to yield a noise predictive output 515. Noise predictive finite impulse response filter circuit 510 includes a number of finite impulse response filter circuits each tuned to a different noise pattern, and a selected one of the finite impulse response filter circuits provides a noise predictive output 515.

Output 145 is provided to a hard decision FIFO 590 that stores a number of bit periods of output 145 on a first in, first out basis. A selector output 595 includes a number of recently received instances of output 145. Selector output 595 selects one of the finite impulse response filter circuits included in noise predictive finite impulse response filter circuit 510. Where, for example, noise predictive finite impulse response filter circuit 510 includes sixteen finite impulse response filter circuits, selector output 595 consists of the four most recent instances of output 145 (X$_k$, X$_{k-1}$, X$_{k-2}$, X$_{k-3}$).

Noise predictive output 515 is provided to a mean calculation circuit 520. Mean calculation circuit 520 calculates a noise predictive mean (NPFIR$_{mean}$) 525, and provides noise predictive mean 525 to a summation circuit 530. In some embodiments of the present invention, noise predictive mean 525 is an average of a defined number of instances of noise predictive output 515. In one particular embodiment, the defined number is one thousand instances or more. Based upon the disclosure provided herein, one of ordinary skill in the art will recognize a variety of values for the defined number. Summation circuit 530 subtracts noise predictive mean 525 from noise predictive output 515 to yield a sum 535 to yield sum 535 in accordance with the following equation:

$$\text{Sum 535} = \text{Noise Predictive Output}_k - \text{NPFIR}_{mean}.$$

Sum 535 is provided to a summation circuit 540.

A bias gain 565 is provided to a bias calculation circuit 570 where it is used to adaptively calculate a bias value 575. In some embodiments of the present invention, bias gain 565 is user programmable. In other embodiments, bias gain 565 is a fixed value. Summation circuit 540 subtracts bias value 575 from sum 535 to yield an error 545 in accordance with the following equation:

$$\text{Error 545} = \text{sum 535} - \text{bias value 575}.$$

Bias value 575 is adaptively updated for each bit period in accordance with the following equation:

$$\text{Bias Value 575} = \text{Bias Value 575} + (\text{Bias Gain 565})(\text{Error 545}).$$

Error 545, filtered output 135, and a tap gain 585 are provided to a filter tap adaptation circuit 550 that calculates calibration output (f$_j$) 155. In comparison with noise predictive calibration circuit 300 described above in relation to FIG. 3, noise predictive calibration circuit 500 does not include mean calculation circuit 302 and summation element 304. This results in the modification of filter tap adaptation circuit 550 where it adaptively calculates calibration output 155 in accordance with the following equation:

$$f_j=f_j-(\text{tap gain 585})(\text{error 545})(\text{filtered output 135}),$$

where f$_j$ is a number (j) of filter taps used by data detector circuit 140. In some embodiments tap gain 585 is programmable, while in other embodiments it is fixed. While noise predictive calibration circuit 500 involves less circuitry than noise predictive calibration circuit 300, calibration output 155 leads to a slower convergence of data detector circuit 140.

Figure 6:
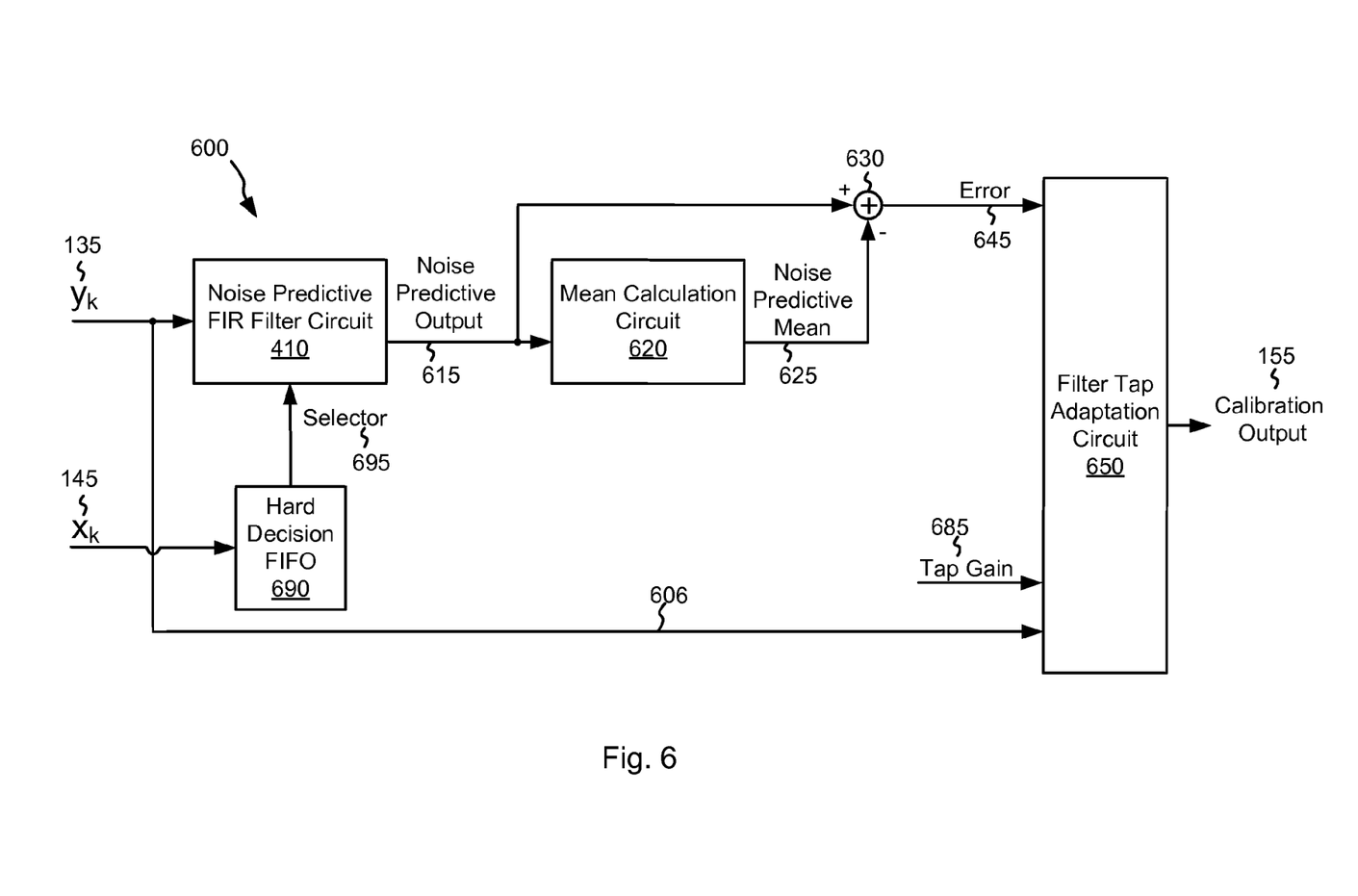
FIG. 6 depicts yet a further noise predictive calibration circuit in accordance with other embodiments of the present invention.

Turning to FIG. 6, another noise predictive calibration circuit 600 is shown in accordance with some embodiments of the present invention. Noise predictive calibration circuit 600 includes a noise predictive finite impulse response filter circuit 610 that performs noise predictive filtering on filtered output (y$_k$) 135 to yield a noise predictive output 615. Noise predictive finite impulse response filter circuit 610 includes a number of finite impulse response filter circuits each tuned to a different noise pattern, and a selected one of the finite impulse response filter circuits provides a noise predictive output 615.

Output 145 is provided to a hard decision FIFO 690 that stores a number of bit periods of output 145 on a first in, first out basis. A selector output 695 includes a number of recently received instances of output 145. Selector output 695 selects one of the finite impulse response filter circuits included in noise predictive finite impulse response filter circuit 610. Where, for example, noise predictive finite impulse response filter circuit 610 includes sixteen finite impulse response filter circuits, selector output 695 consists of the four most recent instances of output 145 (X$_k$, X$_{k-1}$, X$_{k-2}$, X$_{k-3}$).

Noise predictive output 615 is provided to a mean calculation circuit 620. Mean calculation circuit 620 calculates a noise predictive mean (NPFIR$_{mean}$) 625, and provides noise predictive mean 625 to a summation circuit 630. In some embodiments of the present invention, noise predictive mean 625 is an average of a defined number of instances of noise predictive output 615. In one particular embodiment, the defined number is one thousand instances or more. Based upon the disclosure provided herein, one of ordinary skill in the art will recognize a variety of values for the defined number. Summation circuit 430 subtracts noise predictive mean (NPFIR$_{mean}$) 625 from noise predictive output 615 to yield an error 645.

Error 645, filtered output 135, and a tap gain 685 are provided to a filter tap adaptation circuit 650 that calculates calibration output (f$_j$) 155. In comparison with noise predictive calibration circuit 400 described above in relation to FIG. 4, noise predictive calibration circuit 600 does not include mean calculation circuit 402 and summation element 404. This results in the modification of filter tap adaptation circuit 650 where it adaptively calculates calibration output 155 in accordance with the following equation:

$$f_j=f_j-(\text{tap gain 685})(\text{error 645})(\text{filtered output 135}),$$

where $f_j$ is a number (j) of filter taps used by data detector circuit 140. In some embodiments tap gain 685 is programmable, while in other embodiments it is fixed. While noise predictive calibration circuit 600 involves less circuitry than noise predictive calibration circuit 400, calibration output 155 leads to a slower convergence of data detector circuit 140.

Figure 7:
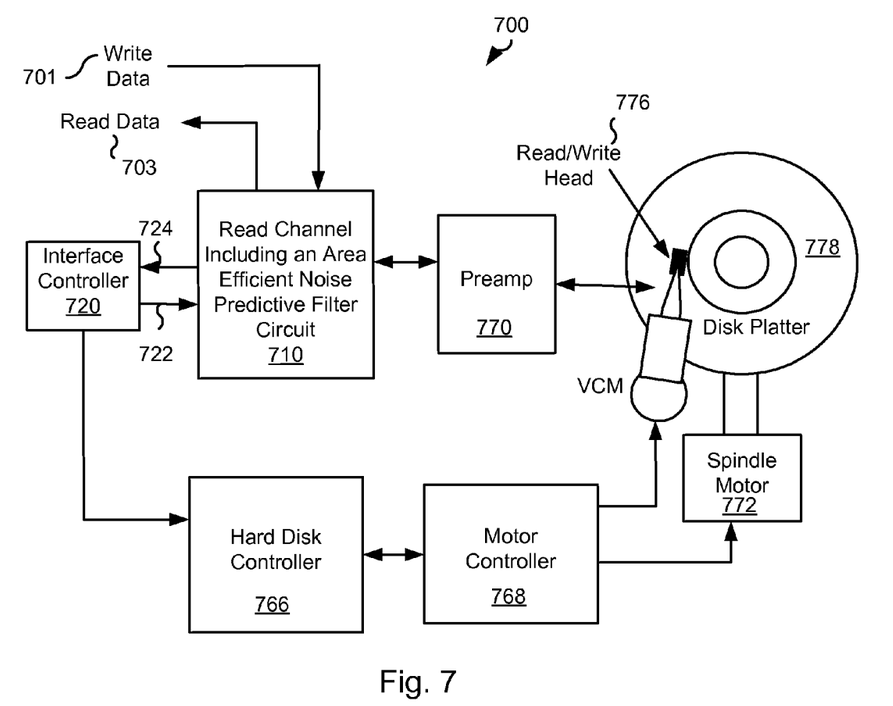
FIG. 7 shows a storage system including an area efficient noise predictive filter circuit in accordance with one or more embodiments of the present invention.

Turning to FIG. 7, a storage system 700 including read channel 710 including an area efficient noise predictive filter circuit in accordance with different embodiments of the present invention. Storage system 700 may be, for example, a hard disk drive. Read channel 710 may include, but is not limited to, a noise predictive filter circuit that may be implemented similar to that discussed above in relation to one of FIGS. 3-6.

Storage system 700 also includes a preamplifier 770, an interface controller 720, a hard disk controller 766, a motor controller 768, a spindle motor 772, a disk platter 778, and a read/write head assembly 776. Interface controller 720 controls addressing and timing of data to/from disk platter 778. The data on disk platter 778 consists of groups of magnetic signals that may be detected by read/write head assembly 776 when the assembly is properly positioned over disk platter 778. In one embodiment, disk platter 778 includes magnetic signals recorded in accordance with a perpendicular recording scheme. For example, the magnetic signals may be recorded as either longitudinal or perpendicular recorded signals.

In a typical read operation, read/write head assembly 776 is accurately positioned by motor controller 768 over a desired data track on disk platter 778. The appropriate data track is defined by an address received via interface controller 720. Motor controller 768 both positions read/write head assembly 776 in relation to disk platter 778 and drives spindle motor 772 by moving read/write head assembly to the proper data track on disk platter 778 under the direction of hard disk controller 766. Spindle motor 772 spins disk platter 778 at a determined spin rate (RPMs). Once read/write head assembly 778 is positioned adjacent the proper data track, magnetic signals representing data on disk platter 778 are sensed by read/write head assembly 776 as disk platter 778 is rotated by spindle motor 772. The sensed magnetic signals are provided as a continuous, minute analog signal representative of the magnetic data on disk platter 778. This minute analog signal is transferred from read/write head assembly 776 to read channel 710 via preamplifier 770. Preamplifier 770 is operable to amplify the minute analog signals accessed from disk platter 778. In turn, read channel module 710 decodes and digitizes the received analog signal to recreate the information originally written to disk platter 778. The read data is provided as read data 703. A write operation is substantially the opposite of the preceding read operation with write data 701 being provided to read channel module 710. This data is then encoded and written to disk platter 778.

It should be noted that storage system 700 may be integrated into a larger storage system such as, for example, a RAID (redundant array of inexpensive disks or redundant array of independent disks) based storage system. It should also be noted that various functions or blocks of storage system 200 may be implemented in either software or firmware, while other functions or blocks are implemented in hardware.

Figure 8:
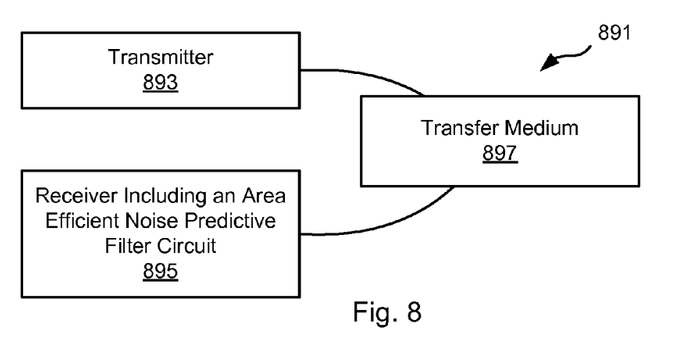
FIG. 8 depicts a communication system including an area efficient noise predictive filter circuit in accordance with some embodiments of the present invention.

Turning to FIG. 8, a communication system 891 including a receiver 895 having an area efficient noise predictive filter circuit in accordance with different embodiments of the present invention. Communication system 891 includes a transmitter 893 that is operable to transmit encoded information via a transfer medium 897 as is known in the art. The encoded data is received from transfer medium 897 by receiver 895. Receiver 895 incorporates a noise predictive filter circuit. The incorporated noise predictive filter circuit is capable of performing noise predictive filtering. Such a noise predictive filter circuit may be implemented similar to that discussed above in relation to one of FIGS. 3-6. Based on the disclosure provided herein, one of ordinary skill in the art will recognize a variety of mediums over which data may be transferred.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for noise predictive filtering. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing circuit, the circuit comprising:
 a noise predictive filter circuit operable to perform a noise predictive filtering process on a data input based upon a selector input to yield a noise predictive output, wherein the selector input is derived from a data detector output;
 a mean calculation circuit operable to average two or more instances of the noise predictive output to yield a mean output;
 a summation circuit operable to subtract the mean output from the noise predictive output to yield a sum output; and
 a filter tap adaptation circuit operable to adaptively calculate a filter tap based at least in part on a value derived from the data input and a value derived from the sum output.

2. The circuit of claim 1, wherein the circuit is implemented as part of an integrated circuit.

3. The circuit of claim 1, wherein the circuit is implemented as part of a device selected from a group consisting of: a storage device and a wireless communication device.

4. The circuit of claim 1, wherein the value derived from the data input is the data input.

5. The circuit of claim 1, wherein the value derived from the sum output is the sum output.

6. The circuit of claim 1, wherein the circuit further comprises a tap gain value, and wherein the filter tap adaptation circuit is further operable to adaptively calculate the filter tap based at least in part on the tap gain value.

7. The circuit of claim 6, wherein the tap gain value is programmable.

8. The circuit of claim 6, wherein the mean calculation circuit is a first mean calculation circuit, wherein the mean output is a first mean output, wherein the summation circuit is a first summation circuit, wherein the sum output is a first sum output, and wherein the circuit further comprises:
 a second mean calculation circuit operable to calculate an average of two or more instances of the data input to yield a second mean output; and
 a second summation circuit operable to subtract the second mean output from the data input to yield a second sum output; and
 wherein the value derived from the data input is the second sum output.

9. The circuit of claim 1, wherein the summation circuit is a first summation circuit, wherein the sum output is a first sum output, wherein the circuit further comprises:
 a second summation circuit operable to subtract a bias value from the first sum output to yield an error value;
 a bias calculation circuit operable to calculate the bias value based at least in part on a bias gain and the error value.

10. The circuit of claim 9, wherein the bias gain is user programmable.

11. The circuit of claim 1, wherein the circuit further comprises:
 a memory circuit operable to store a number of instances of the data detector output to yield the selector input.

12. The circuit of claim 1, wherein the circuit further comprises:
 a data detector circuit operable to apply a data detection algorithm to the data input to yield the data detector output.

13. The circuit of claim 12, wherein the data detector circuit is selected from a group consisting of: a Viterbi algorithm detector circuit, and maximum a posteriori data detector circuit.

14. The circuit of claim 1, wherein the circuit further comprises:
 an equalizer circuit operable to receive a series of digital samples to yield the data input.

15. A data storage device, the storage device comprising:
 a storage medium maintaining a representation of an input data set;
 an analog front end circuit operable to sense the representation of the input data set and to provide the input data set as an analog input;
 an analog to digital converter circuit operable to convert the analog input into a series of digital samples;
 an equalizer circuit operable to receive the series of digital samples to yield a data input; and
 a data processing circuit including:
  a noise predictive filter circuit operable to perform a noise predictive filtering process on a data input based upon a selector input to yield a noise predictive output, wherein the selector input is derived from a data detector output;
  a mean calculation circuit operable to average two or more instances of the noise predictive output to yield a mean output;
  a summation circuit operable to subtract the mean output from the noise predictive output to yield a sum output; and
  a filter tap adaptation circuit operable to adaptively calculate a filter tap based at least in part on a value derived from the data input and a value derived from the sum output.

16. The storage device of claim 15, wherein the value derived from the data input is the data input, and the value derived from the sum output is the sum output.

17. The storage device of claim 15, wherein the mean calculation circuit is a first mean calculation circuit, wherein the mean output is a first mean output, wherein the summation circuit is a first summation circuit, wherein the sum output is a first sum output, and wherein the circuit further comprises:
 a second mean calculation circuit operable to calculate an average of two or more instances of the data input to yield a second mean output; and
 a second summation circuit operable to subtract the second mean output from the data input to yield a second sum output; and
 wherein the value derived from the data input is the second sum output.

18. The circuit of claim 1, wherein the summation circuit is a first summation circuit, wherein the sum output is a first sum output, wherein the circuit further comprises:
 a second summation circuit operable to subtract a bias value from the first sum output to yield an error value, and wherein the error value is the value derived from the sum output; and
 a bias calculation circuit operable to calculate the bias value based at least in part on a bias gain and the error value.

19. A data transmission device, the data transmission device comprising:
 a receiver including a data processing circuit, wherein the data processing circuit includes:
  a noise predictive filter circuit operable to perform a noise predictive filtering process on a data input based upon a selector input to yield a noise predictive output, wherein the selector input is derived from a data detector output;
  a mean calculation circuit operable to average two or more instances of the noise predictive output to yield a mean output;
  a summation circuit operable to subtract the mean output from the noise predictive output to yield a sum output; and
  a filter tap adaptation circuit operable to adaptively calculate a filter tap based at least in part on a value derived from the data input and a value derived from the sum output.

20. The data transmission device of claim 19, wherein the value derived from the data input is the data input, and the value derived from the sum output is the sum output.

21. The data transmission device of claim 19, wherein the mean calculation circuit is a first mean calculation circuit, wherein the mean output is a first mean output, wherein the summation circuit is a first summation circuit, wherein the sum output is a first sum output, and wherein the circuit further comprises:
 a second mean calculation circuit operable to calculate an average of two or more instances of the data input to yield a second mean output; and
 a second summation circuit operable to subtract the second mean output from the data input to yield a second sum output; and
 wherein the value derived from the data input is the second sum output.

22. The data transmission device of claim 19, wherein the summation circuit is a first summation circuit, wherein the sum output is a first sum output, wherein the circuit further comprises:
- a second summation circuit operable to subtract a bias value from the first sum output to yield an error value, and wherein the error value is the value derived from the sum output; and
- a bias calculation circuit operable to calculate the bias value based at least in part on a bias gain and the error value.

* * * * *